(12) United States Patent
Tsang

(10) Patent No.: US 8,445,920 B1
(45) Date of Patent: May 21, 2013

(54) LIGHT EMITTING DIODE

(75) Inventor: Jian-Shihn Tsang, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/396,468

(22) Filed: Feb. 14, 2012

(30) Foreign Application Priority Data

Dec. 19, 2011 (TW) .............................. 100147103 A

(51) Int. Cl.
*H01L 33/00* (2010.01)
(52) U.S. Cl.
USPC ........................................... 257/79; 257/100
(58) Field of Classification Search .................. 257/79, 257/88, 82, 98, E33.001
See application file for complete search history.

(56) References Cited

U.S. PATENT DOCUMENTS

| 2008/0101086 A1* | 5/2008 | Lee | 362/615 |
| 2012/0134137 A1* | 5/2012 | Lee | 362/97.1 |

\* cited by examiner

*Primary Examiner* — Thao P. Le
(74) *Attorney, Agent, or Firm* — Altis Law Group, Inc.

(57) ABSTRACT

A light emitting diode includes a substrate, two electrodes mounted on the substrate, a light emitting diode chip and an encapsulate sealing the light emitting diode chip. The encapsulant is doped with fluorescence particles and light diffusion particles. An average diameter of the diffusion particles is less than that of the fluorescence particles. A concentration of the diffusion particles in a portion of the encapsulant adjacent to a light output surface thereof is larger than that of the diffusion particles in a portion thereof adjacent to the chip. A concentration of the fluorescence particles in the portion of the encapsulant adjacent to the chip is larger than that of the fluorescence particles in the portion of the encapsulant adjacent to the light output surface.

12 Claims, 2 Drawing Sheets

LIGHT EMITTING DIODE

BACKGROUND

1. Technical Field

The present disclosure generally relates to light-emitting devices, and particularly to a light emitting diode (LED).

2. Description of Related Art

With developments in semiconductor technology, LEDs, which are new generation light-emitting devices, are widely used as backlight sources of the liquid crystal displays instead of the cold cathode fluorescent lamps (CCFLs) due to their high light-emitting efficiencies, high brightness and long lifespan.

A typical LED includes a substrate, a blue LED chip mounted on the substrate, and an encapsulant sealing the LED chip. The encapsulant is doped with yellow fluorescence. A light output surface is formed on a top portion of the encapsulant. During operation of the LED, the blue LED chip emits blue light. Part of the blue light is changed to yellow light by the yellow fluorescence. Other part of the blue light mixes with the yellow light, so as to generate white light. However, a distance between a center portion of the light output surface and the LED chip is less than that between an edge portion of the light output surface and the LED chip. Therefore, light transmitting from the LED chip to the edge portion of the light output surface has a longer optical path in the encapsulant than that of the light transmitting from the LED chip to the center portion of the light output surface. This causes yellow light halo to the LED, i.e. light radiating out from the edge portion of the output surface presenting a little yellow (warm white) and light radiating out from the center portion of the output surface presenting a little blue (cool white).

What is needed, therefore, is an LED which can overcome the limitations described.

DETAILED DESCRIPTION

Figure 1:
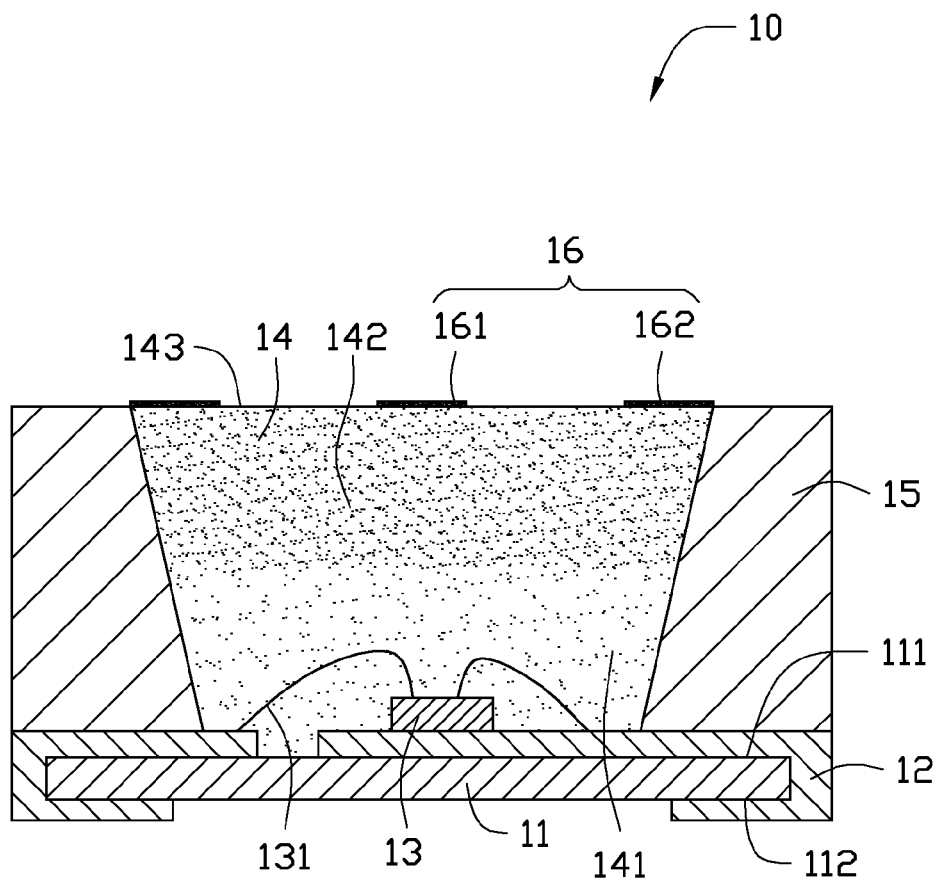
FIG. 1 is a schematic view showing a structure of an LED in accordance with an embodiment of the present disclosure.

Referring to FIG. 1, an LED 10 in accordance with an embodiment of the present disclosure is shown. The LED 10 includes a substrate 11, two electrodes 12, an LED chip 13, an encapsulant 14, a reflector 15 and a light shading layer 16.

The substrate 11 is flat for supporting the electrodes 12, the LED chip 13, and the encapsulant 14. The substrate 11 includes a first surface 111 and a second surface 112 opposite to the first surface 111. The substrate 11 is made of polyphthalamide (PPA), or other electrically insulating materials.

The two electrodes 12 are made of electrically conductive material such as gold, silver, copper, etc. or an alloy thereof. The two electrodes 12 are electrically insulating from each other. Each of the two electrodes 12 extends from the first surface 111 of the substrate 11 to the second surface 112 of the substrate 11 via a lateral edge of the substrate 11.

The LED chip 13 is a blue LED chip made of semiconductor such as SiC, ZnO, AlGaInN, MgZnSeS etc. A preferred semiconductor for the LED chip 13 is AlGaInN. The LED chip 13 is mounted on one of the two electrodes 12 over the first surface 111 of the substrate 11. Two electrical contacts (not labeled) of the LED chip 13 are respectively electrically connected to the two electrodes 12 through wire bonding of two wires 131. In other embodiment, the two electrical contacts of the LED chip 13 can be electrically connected to the two electrodes 12 through flip chip bonding or eutectic bonding.

The encapsulant 14 is formed on the first surface 11 of the substrate 11 and covers on the LED chip 13 and the electrodes 12. The encapsulant 14 is formed through colloid solidification and doped with fluorescence particles 141 and light diffusion particles 142. In this embodiment, the fluorescence particles 141 are yellow fluorescence particles, and the diffusion particles 142 are titanium dioxide particles. In other embodiments, silicon dioxide particles or fluorescence particles without activation also can be used as the diffusion particles 142. An average diameter of the diffusion particles 142 is less than that of the fluorescence particles 141. A light output surface 143 is formed at a top side of the encapsulant 14 opposite to the LED chip 13.

Figure 2:
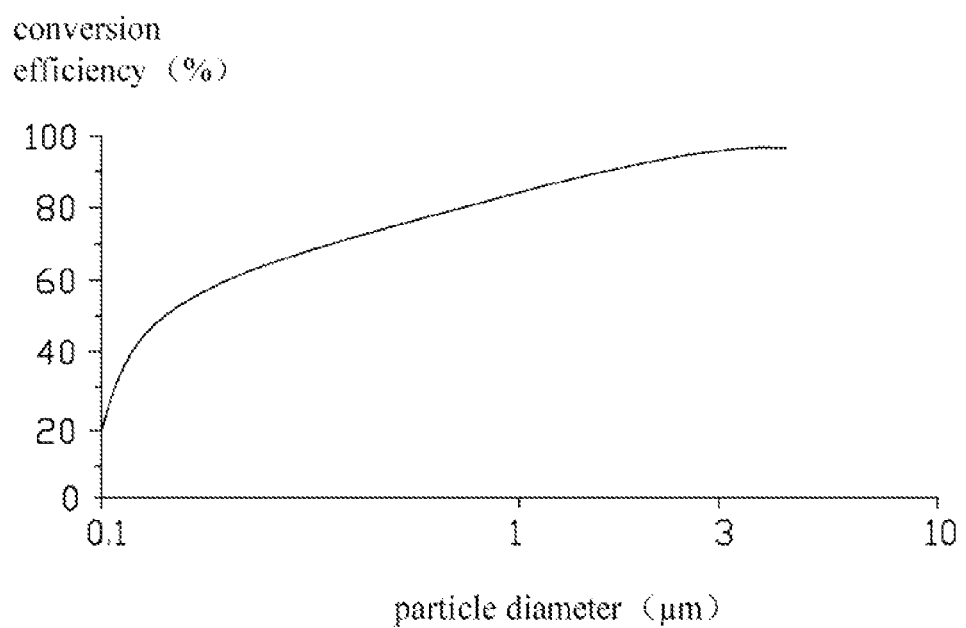
FIG. 2 is a graph indicating a relationship between conversion efficiency and a particle diameter of fluorescence used in the LED of FIG. 1.

Generally, a light conversion efficiency of the fluorescence particles 141 is correlated with a surface area of the fluorescence particles 141. Referring to FIG. 2, when a diameter of a fluorescence particle 141 is less than 3 micron (μm), the conversion efficiency of the fluorescence particles 141 is increased following an increase of the diameter of the fluorescence particle 141. When the diameter of the fluorescence particle 141 is more than 3 μm, the increase of the conversion efficiency of the fluorescence particles 141 is not notable following the increase of the diameter of the fluorescence particle 141. Contrarily if the diameter of the fluorescence particle 141 is too large, the conversion efficiency of the fluorescence particles 141 will be decreased following the increase of the diameter of the fluorescence particle 141 due to a decrease of a bulk surface area of the fluorescence particles 141 since a total number of the fluorescence particles 141 in the encapuslant 14 is decreased. For example, when the diameter of the fluorescence particle 141 is more than 30 μm, the conversion efficiency of the fluorescence particles 141 is markedly decreased following an increase of the diameter of the fluorescence particle 141. Furthermore, the fluorescence particles 141 with a diameter larger than 30 μm have a too quick deposition in the colloid of the encapsulant 14. Therefore, the diameter of each of the fluorescence particles 141 of the encapsulant 14 in this embodiment is ranged from 5 μm to 30 μm. The average diameter of the fluorescence particles 141 of the encapsulant 14 is ranged from 10 μm to 20 μm.

During solidification of the colloid of the encapsulant 14, since the average diameter of the diffusion particles 142 is less than that of the fluorescent particles 141, the fluorescence particles 141 deposit faster than the diffusion particles 142. When the solidification of the colloid of the encapsulant 14 is finished, a portion of the encapsulant 14 adjacent to the LED chip 13 is doped with a high concentration of the fluorescence particles 141, and a portion of the encapsulant 14 away from the LED chip 13 is doped with a high concentration of the diffusion particles 142.

The reflector 15 is mounted on the substrate 11 and surrounds the LED chip 13 and the encapsulant 14, reflecting the light of the LED chip 13. The reflector 15 is made of PPA.

The light shading layer 16 is formed on the light output surface 143 of the encapsulant 14. In this embodiment, the light shading layer 16 is comprised of light shading particles each is a fluorescence particle without activation. In other embodiment, nano-metal particles or black colloid particles also can be coated on the light output surface 143 to act as the light shading particles of the light shading layer 16. The light shading layer 16 includes a middle portion 161 and an outer portion 162 surrounding the middle portion 161. The middle portion 161 is located at a central portion of the light output surface 143 to absorb light output from the encapsulant 14 which has a higher color temperature (cool white). The outer portion 162 is located at an edge portion of the light output surface 143 to absorb light output from the encapsulant 14 which has a lower color temperature (warm white). Thus, the light temperature of the light output from the encapsulant 14 trends to uniformity.

Alternatively, the light shading layer 16 also can be formed in the encapsulant 14 beneath the light output surface 143. In this state, an average diameter of the light shading particles of the light shading layer 16 is larger or less than that of the fluorescence particles 141. When the average diameter of the light shading particles of the light shading layer 16 is larger than that of the fluorescence particles 141, the light shading layer 16 is formed in a portion of the encapsulant 14 adjacent to the LED chip 13, and the concentration of the particles of the light shading layer 16 in a portion of the encapsulant 14 adjacent to the light emitting diode chip 13 is larger than that of the particles of the light shading layer 16 in a portion of the encapsulant 14 adjacent to the light output surface 143. When the average diameter of the light shading particles of the light shading layer 16 is less than that of the fluorescence particles 141, the light shading layer 16 is formed in a portion of the encapsulant 14 adjacent to the light output surface 143 of the encapsulant 14, and the concentration of the light shading particles of the light shading layer 16 in a portion of the encapsulant 14 adjacent to the light output surface 143 is larger than that of the particles of the light shading layer 16 in a portion of the encapsulant 14 adjacent to the light emitting diode chip 13. A total weight of the light shading particles of the light shading layer 16 in the encapsulant 14 is preferably more than a third of a total weight of the fluorescence particles 141 in the encapsulant 14 to achieve a good light shading effect.

During operation of the LED 10, the blue LED chip 13 emits blue light. Part of the blue light is changed to yellow light. The yellow light is then refracted by the diffusion particle 142 and mixes with the other part of blue light emitted by the LED chip 13, so as to generate mixed light, such as white light. Since both the optical paths of the blue light and the yellow light are changed by the diffusion particle 142 in the portion of the encapsulant 14 away from the LED chip 13, the blue light and the yellow light are mixed fully in the portion of the encapsulant 14 away from the LED chip 13. Furthermore, the light shading layer 16 causes the light temperature of the light output from the encapsulant 14 to trend to uniformity, yellow light halo is thus avoided.

It is to be understood, however, that even though numerous characteristics and advantages of the exemplary embodiments have been set forth in the foregoing description, together with details of the structures and functions of the embodiments, the disclosure is illustrative only; and that changes may be made in detail, especially in matters of shape, size, and arrangement of parts within the principles of the embodiments to the full extent indicated by the broad general meaning of the terms in which the appended claims are expressed.

What is claimed is:

1. A light emitting diode comprising:
a substrate;
two electrodes mounted on the substrate;
a light emitting diode chip mounted over the substrate and electrically connected with the two electrodes; and
an encapsulant sealing the light emitting diode chip, a light output surface being provided on the encapsulant opposite to and away from the light emitting diode chip, the encapsulant being doped with fluorescence particles and light diffusion particles, an average diameter of the diffusion particles being less than that of the fluorescence particles, a concentration of the diffusion particles in a portion of the encapsulant adjacent to the light output surface being larger than that of the diffusion particles in a portion of the encapsulant adjacent to the light emitting diode chip, a concentration of the fluorescence particles in the portion of the encapsulant adjacent to the light emitting diode chip being larger than that of the fluorescence particles in the portion of the encapsulant adjacent to the light output surface.

2. The light emitting diode of claim 1, wherein the diffusion particles are chosen from a group comprised of titanium dioxide particles, silicon dioxide particles and fluorescence particles without activation.

3. The light emitting diode of claim 1, wherein an average diameter of the fluorescence particles is ranged from 10 μm to 20 μm.

4. The light emitting diode of claim 1, further comprising a light shading layer incorporating with the encapsulant.

5. The light emitting diode of claim 4, wherein the light shading layer is located on the light output surface of the encapsulant.

6. The light-emitting device of claim 4, wherein the light shading layer includes a middle portion located at a central portion of the light output surface and an outer portion located at an edge portion of the light output surface.

7. The light-emitting device of claim 6, wherein the outer portion surrounds the middle portion of the light shading layer.

8. The light-emitting device of claim 4, wherein the light shading layer is formed by a plurality of light shading particles and located beneath the light output surface of the encapsulant.

9. The light-emitting device of claim 8, wherein an average diameter of the light shading particles is less than that of the fluorescence particles, and a concentration of the light shading particles in a portion of the encapsulant adjacent to the light output surface is larger than that of the light shading particles in a portion of the encapsulant adjacent to the light emitting diode chip.

10. The light-emitting device of claim 9, wherein a total weight of the light shading particles in the encapsulant is more than a third of a total weight of the fluorescence particles in the encapsulant.

11. The light-emitting device of claim 8, wherein an average diameter of the light shading particles is larger than that of the fluorescence particles, and a concentration of the light shading particles in a portion of the encapsulant adjacent to the light emitting diode chip is larger than that of the light shading particles in a portion of the encapsulant adjacent to the light output surface.

12. The light-emitting device of claim 8, wherein the light shading particles are chosen from a group comprised of nano-metal particles, black colloid particles and fluorescence particles without activation.

* * * * *